(12) United States Patent
Yu et al.

(10) Patent No.: US 10,868,000 B2
(45) Date of Patent: Dec. 15, 2020

(54) SEMICONDUCTOR DEVICE STRUCTURE WITH EPITAXIAL STRUCTURE AND METHOD FOR FORMING THE SAME

(71) Applicant: Taiwan Semiconductor Manufacturing Co., Ltd., Hsinchu (TW)

(72) Inventors: Li-Zhen Yu, New Taipei (TW); Tien-Lu Lin, Hsinchu (TW); Jia-Chuan You, Dayuan Township, Taoyuan County (TW); Chia-Hao Chang, Hsinchu (TW); Yu-Ming Lin, Hsinchu (TW); Chih-Hao Wang, Baoshan Township, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/257,375

(22) Filed: Jan. 25, 2019

(65) Prior Publication Data

US 2020/0243519 A1    Jul. 30, 2020

(51) Int. Cl.
*H01L 21/8234* (2006.01)
*H01L 27/088* (2006.01)
*H01L 29/78* (2006.01)
*H01L 29/66* (2006.01)
(Continued)

(52) U.S. Cl.
CPC ...... *H01L 27/0886* (2013.01); *H01L 21/0332* (2013.01); *H01L 21/0337* (2013.01); *H01L 21/823431* (2013.01); *H01L 21/823437* (2013.01); *H01L 21/823468* (2013.01); *H01L 21/823475* (2013.01); *H01L 29/517* (2013.01); *H01L 29/66795* (2013.01); *H01L 29/785* (2013.01)

(58) Field of Classification Search
CPC ..... H01L 21/823431; H01L 21/823418; H01L 21/0332
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Mark V Prenty
(74) *Attorney, Agent, or Firm* — Birch, Stewart, Kolasch & Birch, LLP

(57) ABSTRACT

A method for forming a semiconductor device structure is provided. The method includes forming a first epitaxial structure and a second epitaxial structure over a semiconductor substrate. The method includes forming a dielectric layer over the first epitaxial structure, the second epitaxial structure, and the semiconductor substrate. The method includes forming a first mask layer over the dielectric layer and between the first epitaxial structure and the second epitaxial structure. The method includes forming a second mask layer over the dielectric layer and the first mask layer. The method includes partially removing the dielectric layer covering the first epitaxial structure and the second epitaxial structure. The method includes removing the first mask layer. The method includes forming a first conductive layer and a second conductive layer respectively in the first recess and the second recess.

20 Claims, 21 Drawing Sheets

(51) Int. Cl.
*H01L 29/51* (2006.01)
*H01L 21/033* (2006.01)

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,157,988 B1 * | 12/2018 | You .................. H01L 29/66545 |

\* cited by examiner

SEMICONDUCTOR DEVICE STRUCTURE WITH EPITAXIAL STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 2A-1 is a top view of the semiconductor device structure of FIG. 2A, in accordance with some embodiments.

FIG. 2A-2 is a cross-sectional view illustrating the semiconductor device structure along a sectional line I-I' in FIG. 2A-1, in accordance with some embodiments.

FIG. 2A-3 is a cross-sectional view illustrating the semiconductor device structure along a sectional line II-II' in FIG. 2A-1, in accordance with some embodiments.

FIG. 2A-4 is a cross-sectional view illustrating the semiconductor device structure along a sectional line III-III' in FIG. 2A-1, in accordance with some embodiments.

FIG. 2C-1 is a top view of the semiconductor device structure of FIG. 2C, in accordance with some embodiments.

FIG. 2D-1 is a top view of the semiconductor device structure of FIG. 2D, in accordance with some embodiments.

FIG. 2E-1 is a top view of the semiconductor device structure of FIG. 2E, in accordance with some embodiments.

FIG. 2F-1 is a top view of the semiconductor device structure of FIG. 2F, in accordance with some embodiments.

FIG. 2I-1 is a top view of the semiconductor device structure of FIG. 2I, in accordance with some embodiments.

FIG. 2I-2 is a cross-sectional view illustrating the semiconductor device structure along a sectional line II-II' in FIG. 2I-1, in accordance with some embodiments.

FIG. 2I-3 is a cross-sectional view illustrating the semiconductor device structure along a sectional line III-III' in FIG. 2I-1, in accordance with some embodiments.

DETAILED DESCRIPTION

Figure 1:
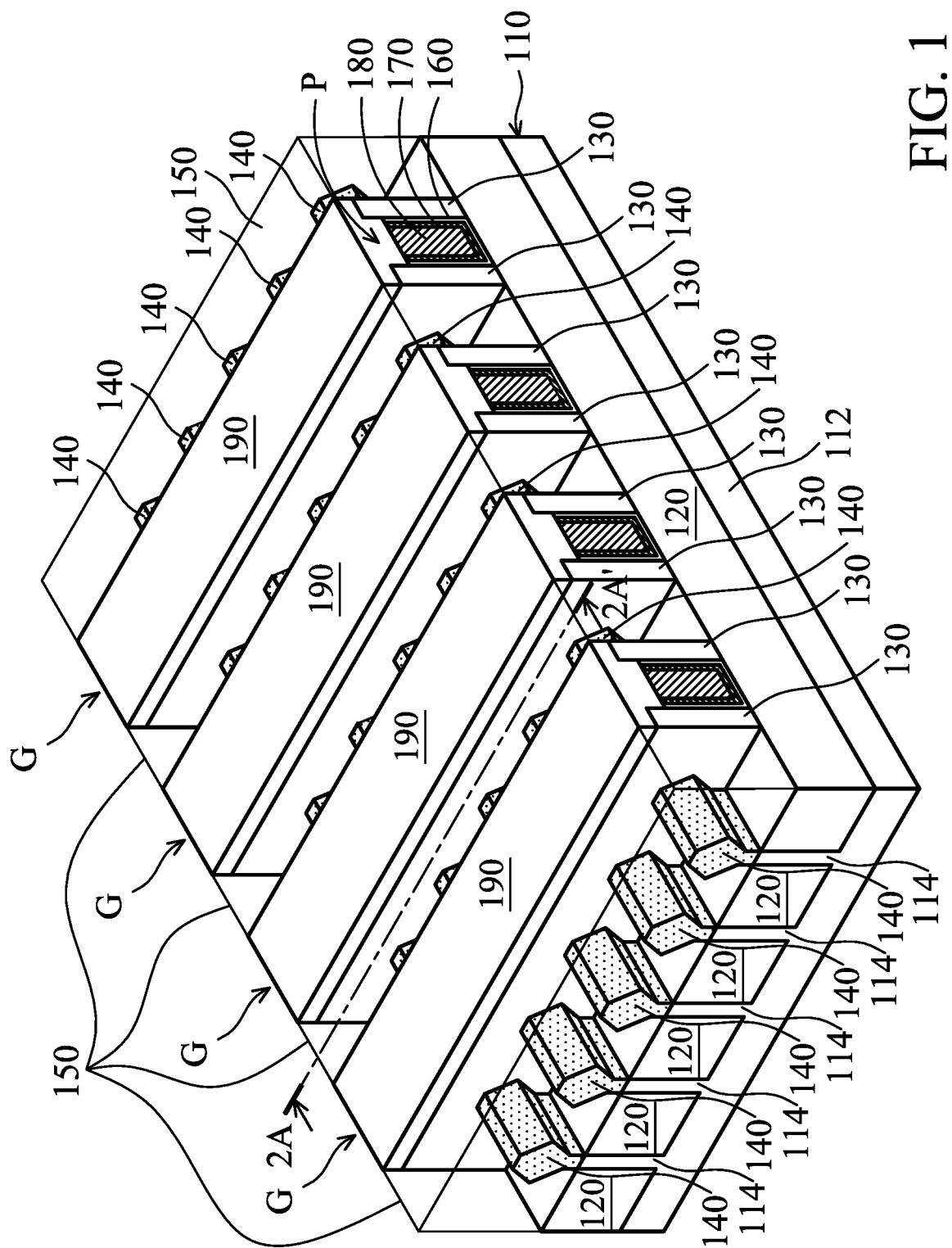
FIG. 1 is a perspective view of a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2A:
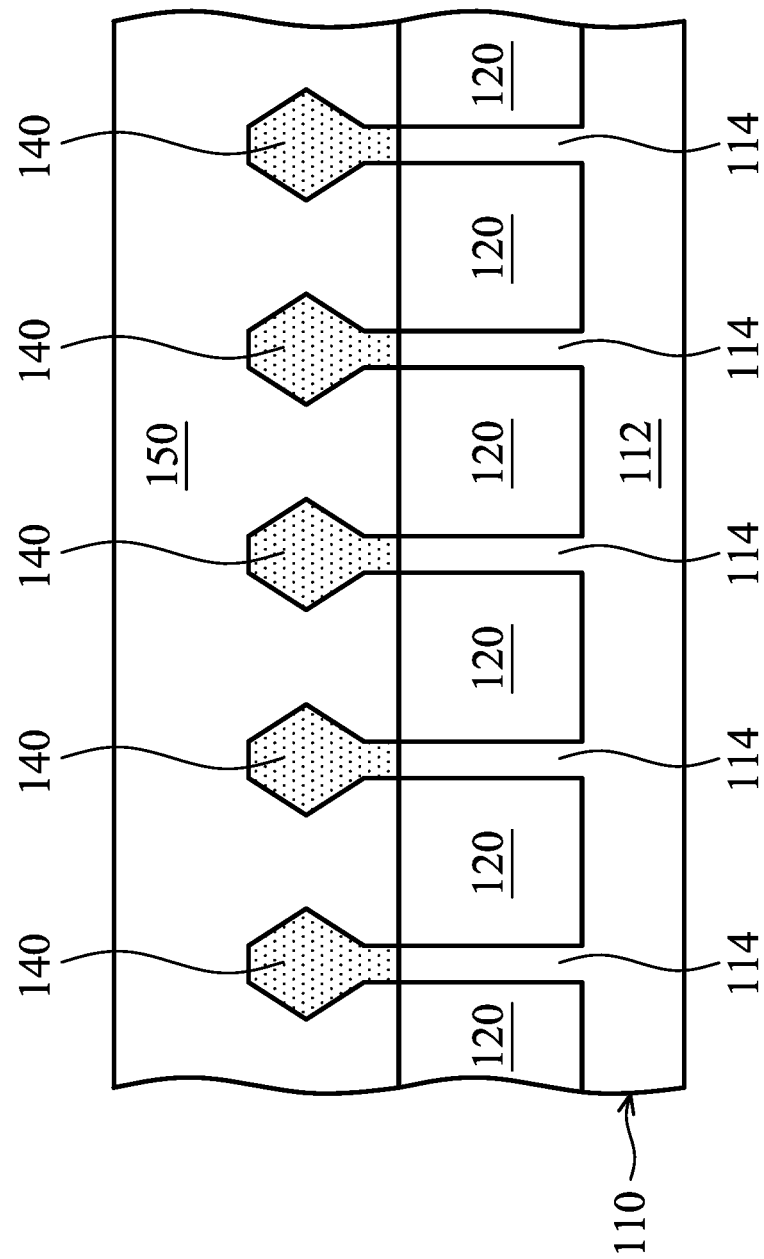
FIGS. 2A-2I are cross-sectional views of various stages of a process for forming a semiconductor device structure, in accordance with some embodiments.
Figures 1, 2A:
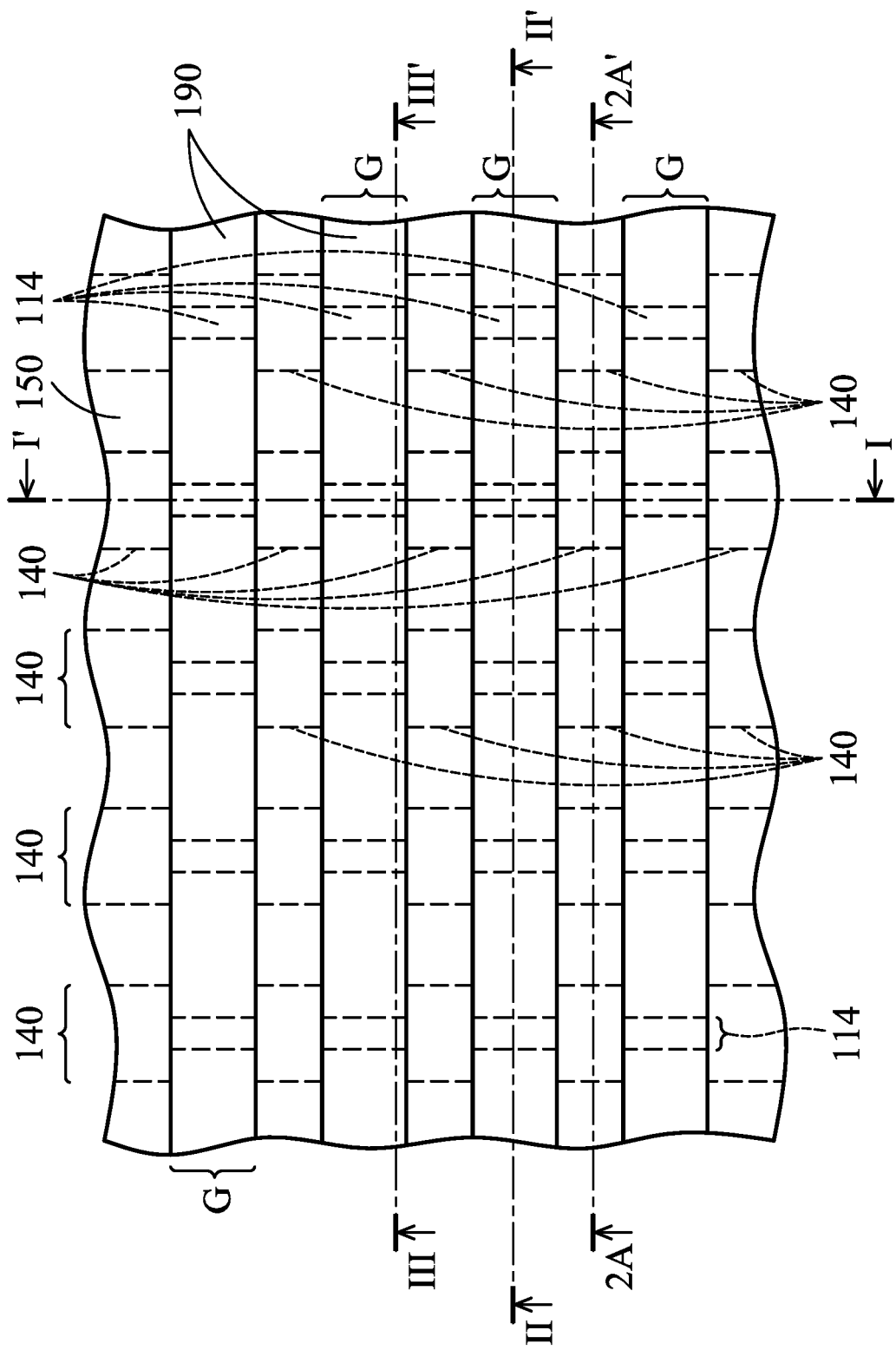
Figures 2, 2A:
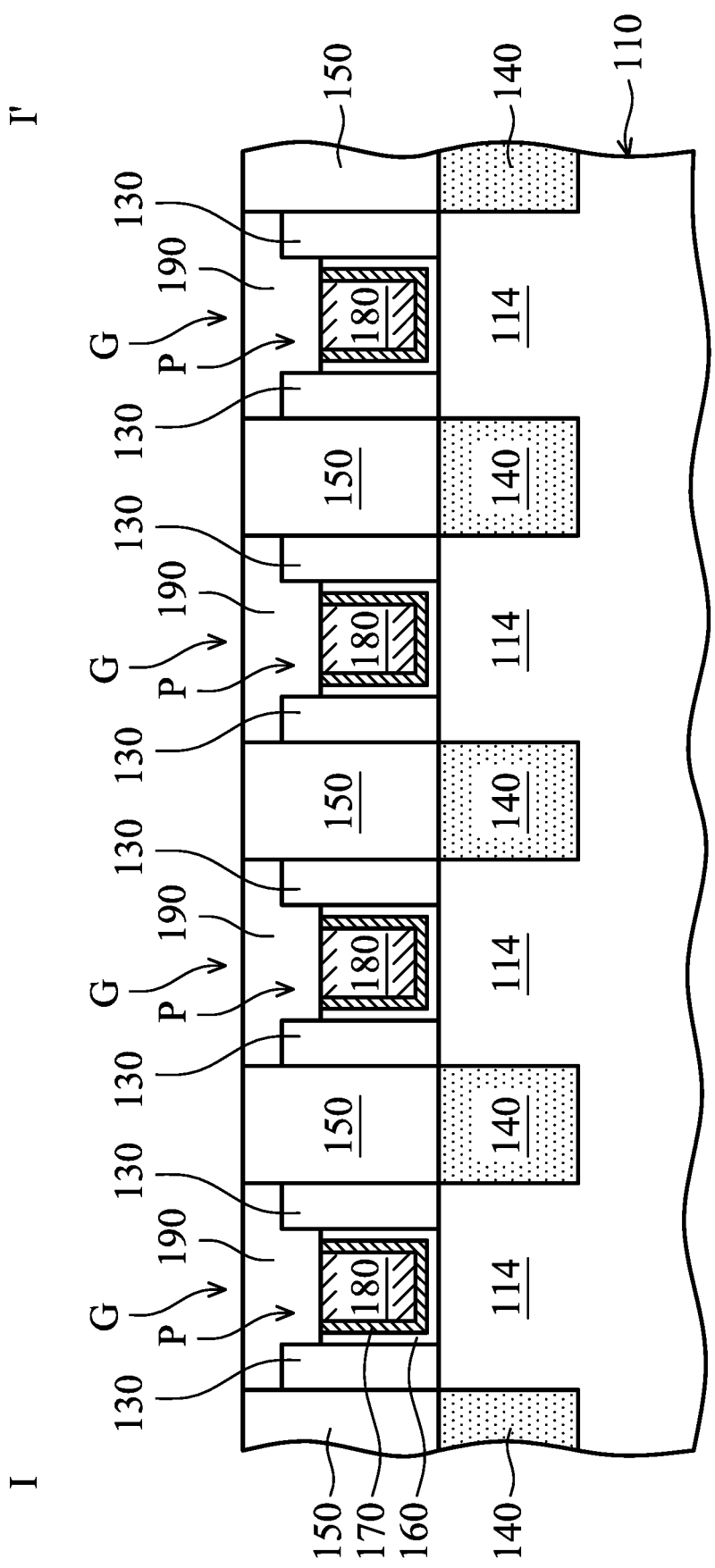
Figures 2, 2A, 3:
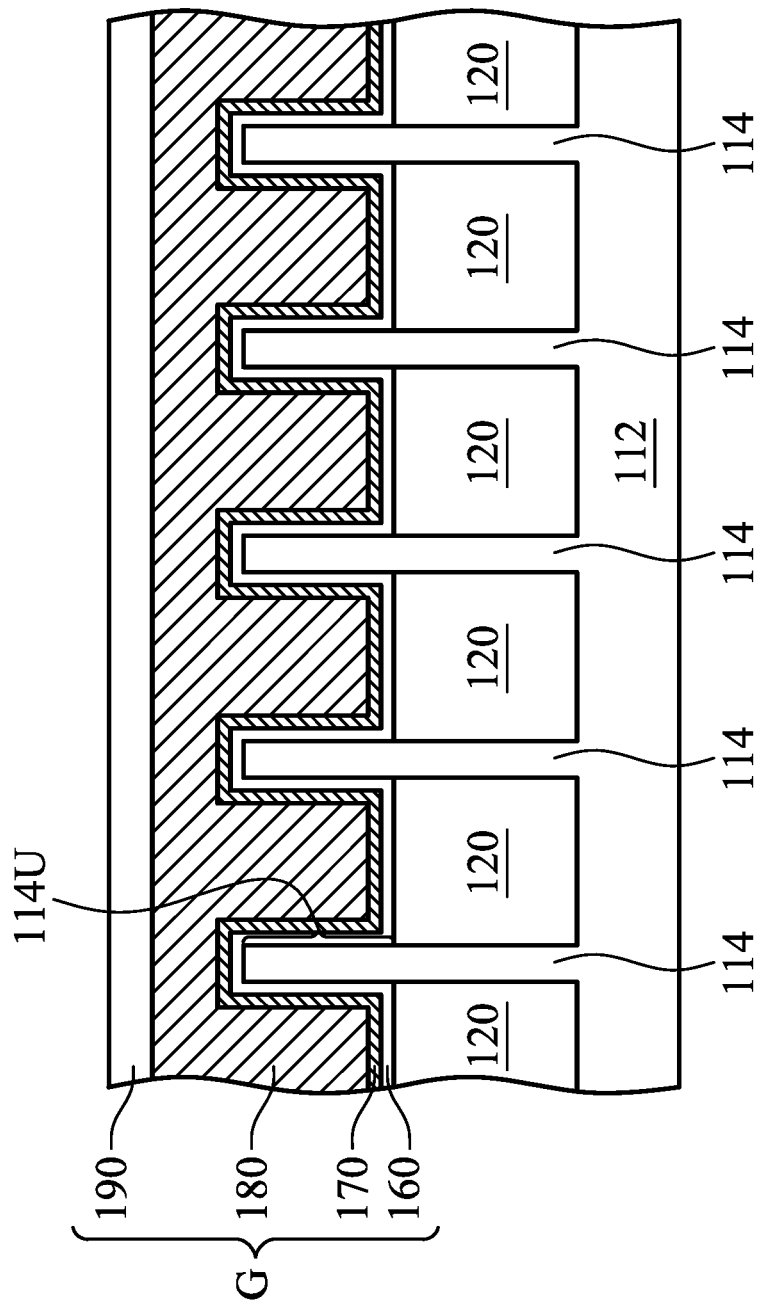
Figures 2, 2A, 3, 4:
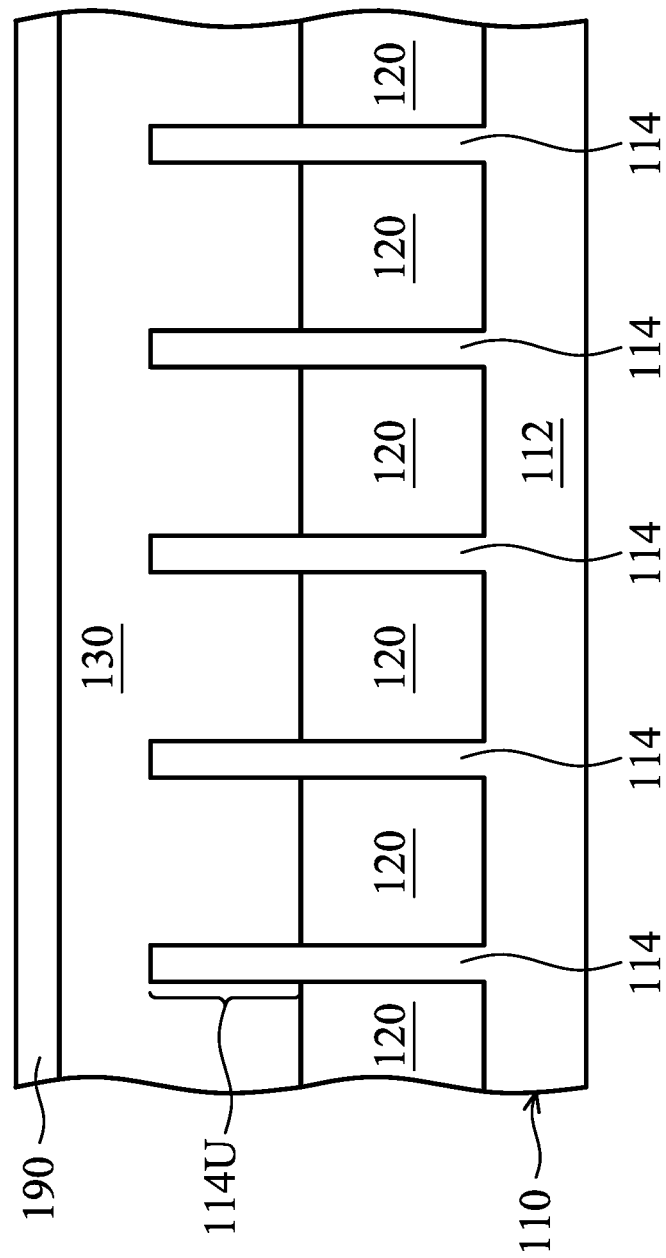

FIG. 1 is a perspective view of a semiconductor device structure, in accordance with some embodiments. FIG. 2A-1 is a top view of the semiconductor device structure of FIG. 1 or 2A, in accordance with some embodiments. FIG. 2A is a cross-sectional view illustrating the semiconductor device structure along a sectional line 2A-2A' in FIG. 1 or 2A-1, in accordance with some embodiments. FIG. 2A-2 is a cross-sectional view illustrating the semiconductor device structure along a sectional line I-I' in FIG. 2A-1, in accordance with some embodiments. FIG. 2A-3 is a cross-sectional view illustrating the semiconductor device structure along a sectional line II-II' in FIG. 2A-1, in accordance with some embodiments. FIG. 2A-4 is a cross-sectional view illustrating the semiconductor device structure along a sectional line III-III' in FIG. 2A-1, in accordance with some embodiments.

As shown in FIGS. 1, 2A, 2A-1, and 2A-2, a substrate 110 is provided, in accordance with some embodiments. The substrate 110 has a base portion 112 and fin structures 114, in accordance with some embodiments. The fin structures 114 are over the base portion 112, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIGS. 1 and 2A, an isolation layer 120 is formed over the base portion 112, in accordance with some embodiments. The isolation layer 120 is between the fin structures 114, in accordance with some embodiments. The isolation layer 120 is made of an insulating material, such as oxide (such as silicon oxide), fluorosilicate glass (FSG), a low-k dielectric material, and/or another suitable insulating material. The isolation layer 120 may be deposited by an atomic layer deposition (ALD) process, a chemical vapor deposition (CVD) process, or another applicable process.

As shown in FIGS. 1, 2A-1, 2A-2, and 2A-4, spacers 130 are formed over the isolation layer 120 and the fin structures 114, in accordance with some embodiments. As shown in FIGS. 1 and 2A-4, the spacers 130 wrap around upper portions 114U of the fin structures 114, in accordance with some embodiments.

The spacers 130 are single-layered structures or multi-layered structures, in accordance with some embodiments. The spacers 130 are made of an insulating material, such as silicon nitride, silicon oxide, silicon carbide, silicon oxynitride, or another applicable insulating material.

As shown in FIGS. 1, 2A, 2A-1, and 2A-2, epitaxial structures 140 are formed over the fin structures 114, in accordance with some embodiments. In some embodiments, the epitaxial structures 140 are made of an N-type conductivity material, in accordance with some embodiments. The N-type conductivity material includes silicon phosphorus (SiP) or another suitable N-type conductivity material. The epitaxial structures 140 are doped with the Group VA element, in accordance with some embodiments. The Group VA element includes phosphor (P), antimony (Sb), or another suitable Group VA material.

In some other embodiments, the epitaxial structures 140 are made of a P-type conductivity material, in accordance with some embodiments. The P-type conductivity material includes silicon germanium (SiGe) or another suitable P-type conductivity material. The epitaxial structures 140 are doped with the Group IIIA element, in accordance with some embodiments. The Group IIIA element includes boron or another suitable material. The epitaxial structures 140 are formed using an epitaxial process, in accordance with some embodiments.

As shown in FIG. 1, a dielectric layer 150 is formed over the epitaxial structures 140 and the isolation layer 120, in accordance with some embodiments. For the sake of clarity, the epitaxial structures 140, the isolation layer 120, and the spacers 130 covered by the dielectric layer 150 are shown using solid lines in FIG. 1, in accordance with some embodiments. The dielectric layer 150 is made of oxide, such as silicon oxide (e.g., $SiO_2$), in accordance with some embodiments.

As shown in FIGS. 1 and 2A-1, two adjacent spacers 130 are spaced apart by a gap P, in accordance with some embodiments. The gap P partially exposes the fin structures 114, in accordance with some embodiments. As shown in FIGS. 1, 2A-1, and 2A-3, a gate dielectric layer 160 is formed to cover bottoms of the gaps P, in accordance with some embodiments. The gate dielectric layer 160 is made of a dielectric material, such as a high dielectric constant (high-k) material, in accordance with some embodiments.

The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), another suitable high-k dielectric material, or a combination thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof.

As shown in FIGS. 1, 2A-1, and 2A-3, a work function metal layer 170 is deposited over the gate dielectric layer 160, in accordance with some embodiments. The work function metal layer 170 provides a desired work function for transistors to enhance device performance including improved threshold voltage.

In the embodiments of forming an NMOS transistor, the work function metal layer 170 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 170 can be a p-type metal capable of providing a work function value suitable for the device, such as equal to or greater than about 4.8 eV. The p-type metal may be made of metal, metal carbide, metal nitride, another suitable material, or a combination thereof. For example, the p-type metal is made of titanium, titanium nitride, hafnium, zirconium, titanium, tantalum, aluminum, hafnium carbide, zirconium carbide, aluminides, ruthenium, another suitable material, or a combination thereof.

As shown in FIGS. 1, 2A-1, and 2A-3, a gate electrode layer 180 (also called a metal gate electrode layer) is deposited over the work function metal layer 170, in accordance with some embodiments. The gate electrode layer 180 is made of a suitable metal material, such as aluminum, tungsten, gold, platinum, cobalt, another suitable metal, an alloy thereof, or a combination thereof, in accordance with some embodiments.

As shown in FIGS. 1, 2A-1, and 2A-3, a protection layer 190 is formed over the spacers 130, the gate dielectric layer 160, the work function metal layer 170, and the gate electrode layer 180, in accordance with some embodiments. The protection layer 190 is made of a dielectric material, such as a nitrogen-containing material (e.g., silicon nitride), in accordance with some embodiments.

The gate dielectric layer 160, the work function metal layer 170, the gate electrode layer 180, and the protection layer 190 in the same gap P together form a gate stack G, in accordance with some embodiments. The gate stacks G wrap around the upper portions 114U of the fin structures 114, in accordance with some embodiments. Each gate stack G is between two adjacent spacers 130, in accordance with some embodiments.

Figure 2B:
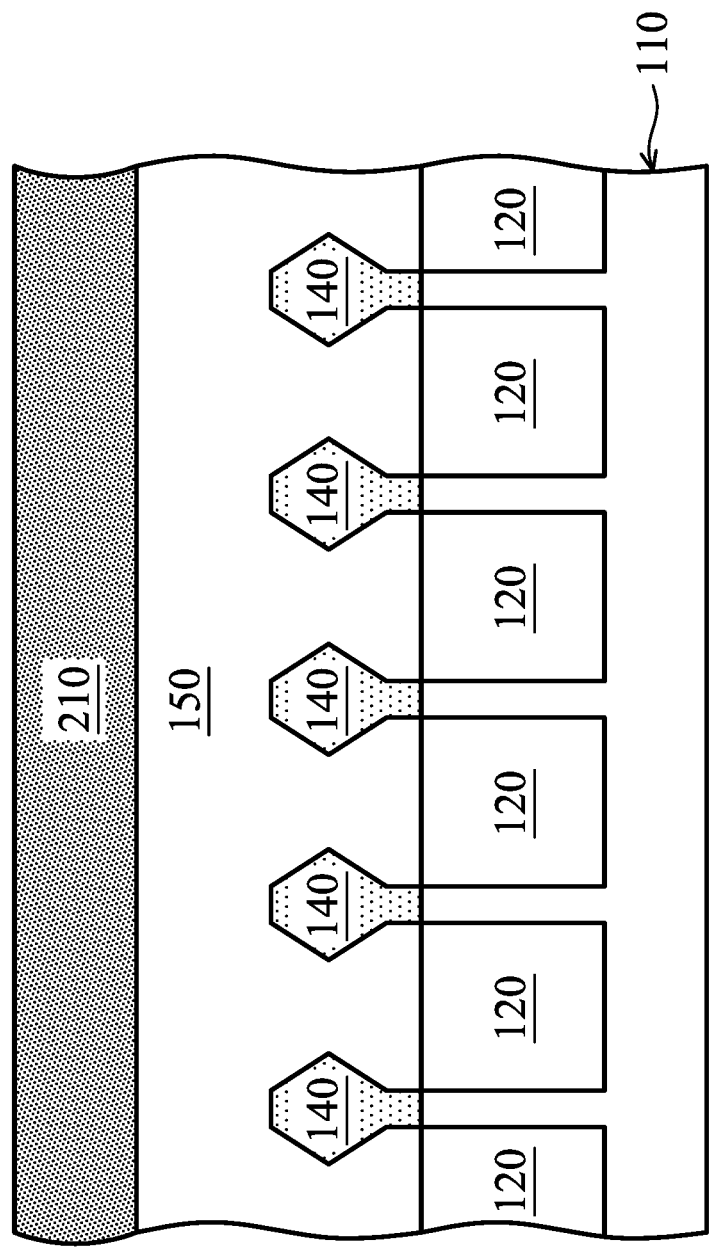

FIGS. 2A-2I are cross-sectional views of various stages of a process for forming a semiconductor device structure, in accordance with some embodiments. After the step of FIG. 2A, as shown in FIG. 2B, a mask layer 210 is formed over the dielectric layer 150 and the gate stacks G (as shown in FIG. 2A-1), in accordance with some embodiments.

The mask layer 210 is made of a nitrogen containing material (e.g., silicon nitride), Si, a tungsten containing material (e.g., W or WC) or another suitable material, in accordance with some embodiments. The mask layer 210 is formed using a deposition process, such as a chemical vapor deposition (CVD) process, an atomic layer deposition (ALD) process, or a physical vapor deposition (PVD) process, in accordance with some embodiments.

Figure 2C:
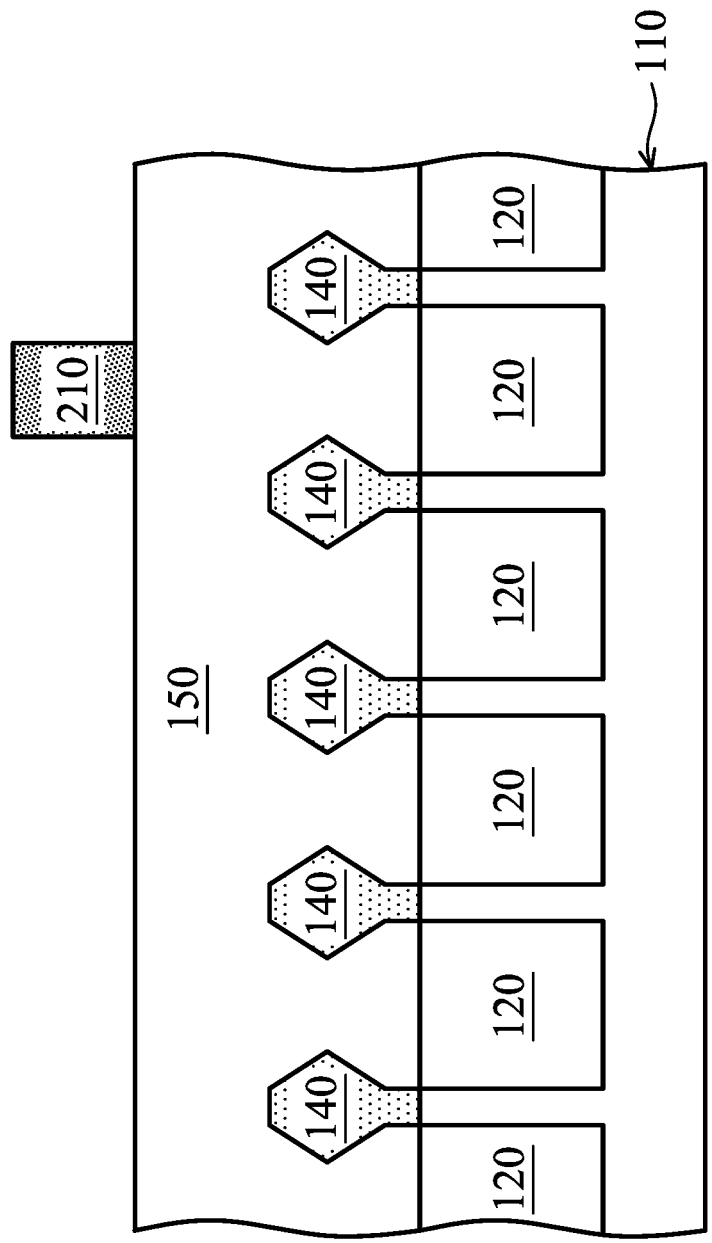
Figures 1, 2C:
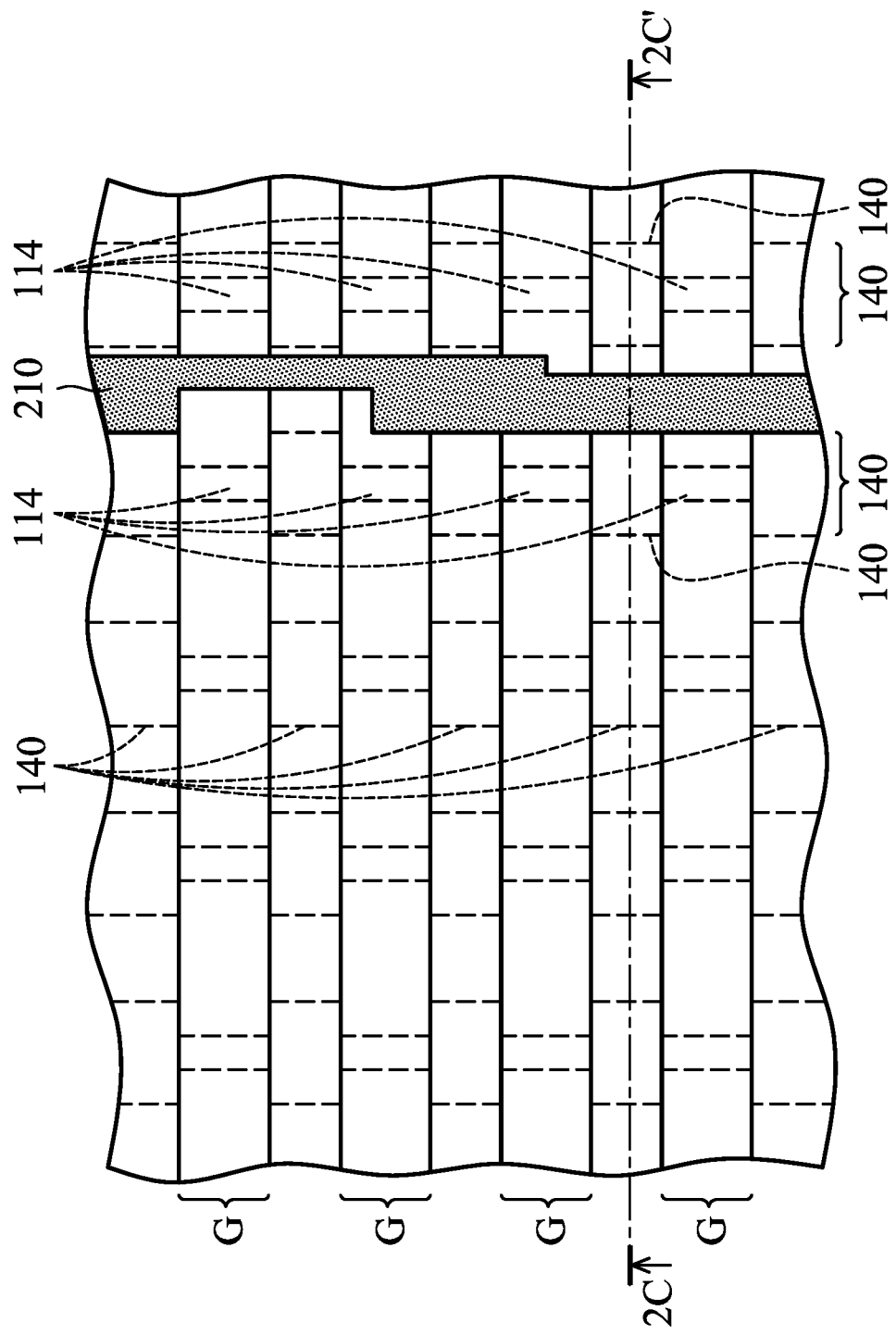

FIG. 2C-1 is a top view of the semiconductor device structure of FIG. 2C, in accordance with some embodiments. FIG. 2C is a cross-sectional view illustrating the semiconductor device structure along a sectional line 2C-2C' in FIG. 2C-1, in accordance with some embodiments.

As shown in FIGS. 2C and 2C-1, portions of the mask layer 210 are removed, in accordance with some embodiments. The remaining mask layer 210 is between the fin structures 114, in accordance with some embodiments. The remaining mask layer 210 is between the epitaxial structures 140, in accordance with some embodiments. The removal process includes a photolithography process and an etching process, in accordance with some embodiments.

Figure 2D:
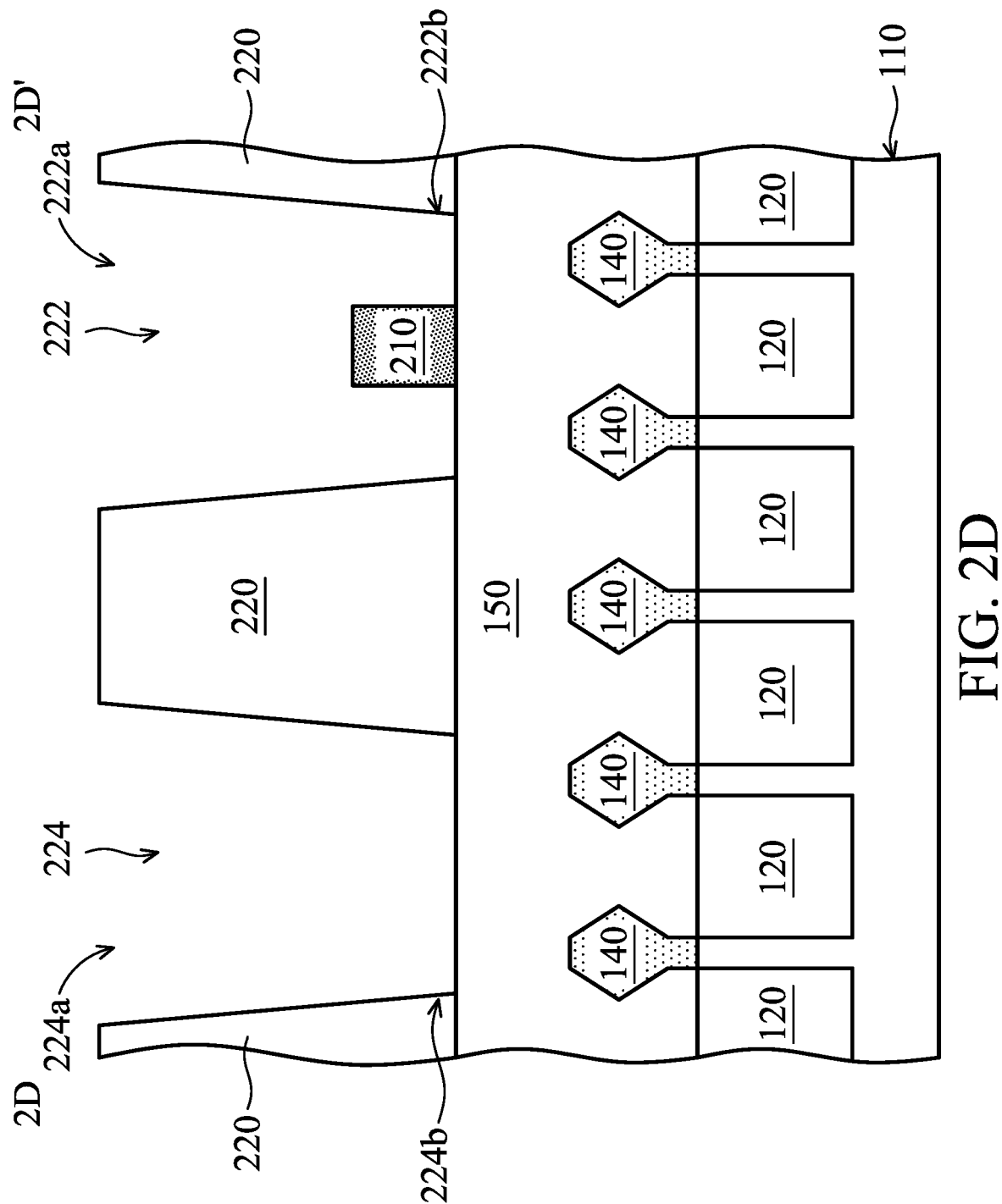
Figures 1, 2D:
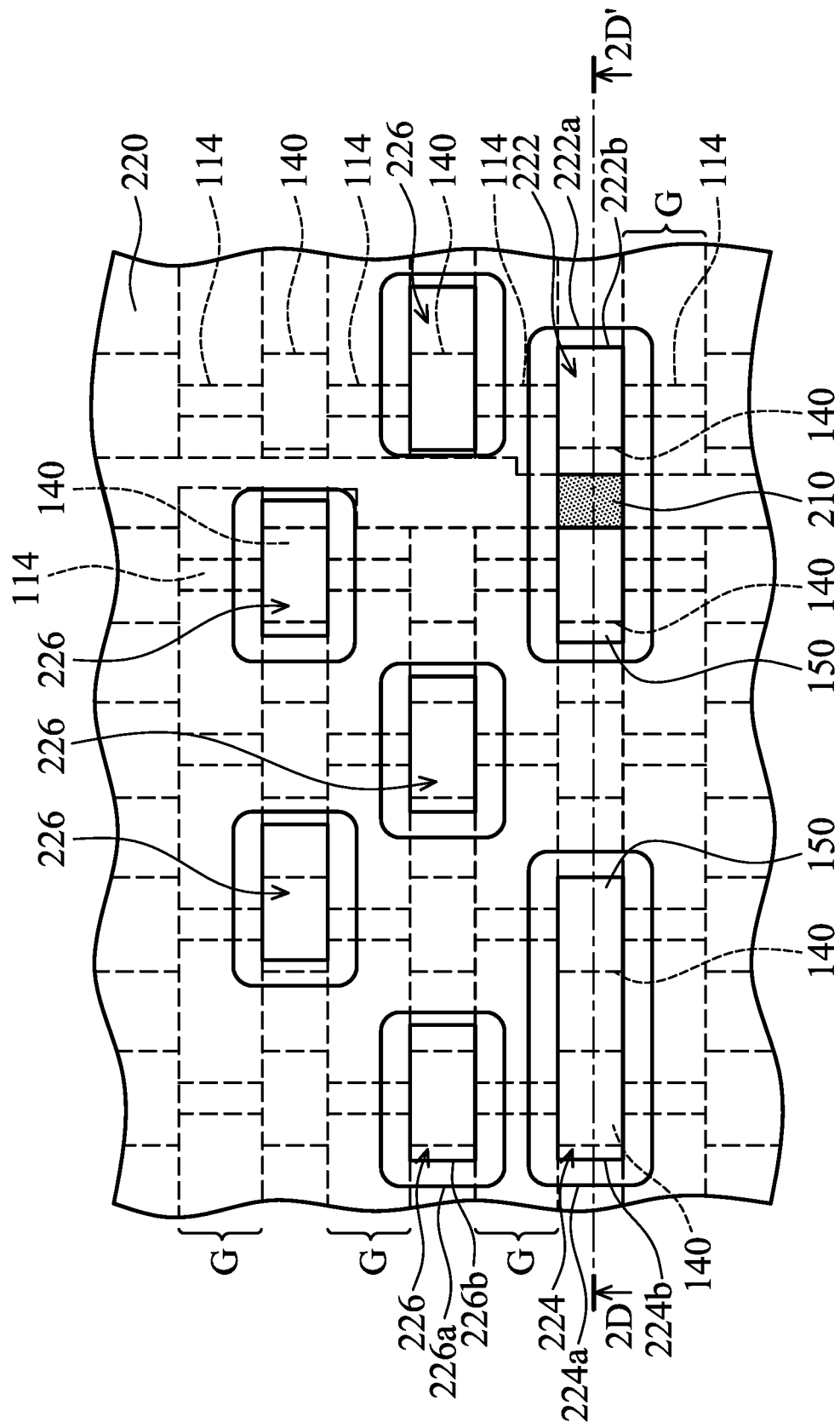

FIG. 2D-1 is a top view of the semiconductor device structure of FIG. 2D, in accordance with some embodiments. FIG. 2D is a cross-sectional view illustrating the semiconductor device structure along a sectional line 2D-2D' in FIG. 2D-1, in accordance with some embodiments.

As shown in FIGS. 2D and 2D-1, a mask layer 220 is formed over the dielectric layer 150, the gate stacks G, and the mask layer 210, in accordance with some embodiments. The mask layer 220 has openings 222, 224, and 226, in accordance with some embodiments. The opening 222 partially exposes the mask layer 210 and the dielectric layer 150 covering two adjacent epitaxial structures 140, in accordance with some embodiments.

The opening 222 extends continuously across the two adjacent epitaxial structures 140 and the mask layer 210, in accordance with some embodiments. The opening 224 partially exposes the dielectric layer 150 covering another two adjacent epitaxial structures 140, in accordance with some embodiments. The opening 224 extends continuously across the two adjacent epitaxial structures 140, in accordance with some embodiments.

The opening 226 partially exposes the dielectric layer 150 covering one of the epitaxial structures 140, in accordance with some embodiments. The opening 226 extends continuously across the epitaxial structure 140, in accordance with some embodiments. In some embodiments, tops 222a, 224a, and 226a of the openings 222, 224, and 226 are respectively wider than bottoms 222b, 224b, and 226b of the openings 222, 224, and 226.

The mask layer 220 is thicker than the mask layer 210, in accordance with some embodiments. The mask layers 210 and 220 are made of different materials, in accordance with some embodiments. The mask layer 220 is made of an insulating material, such as a polymer material (e.g., a photoresist material), in accordance with some embodiments.

Figure 2E:
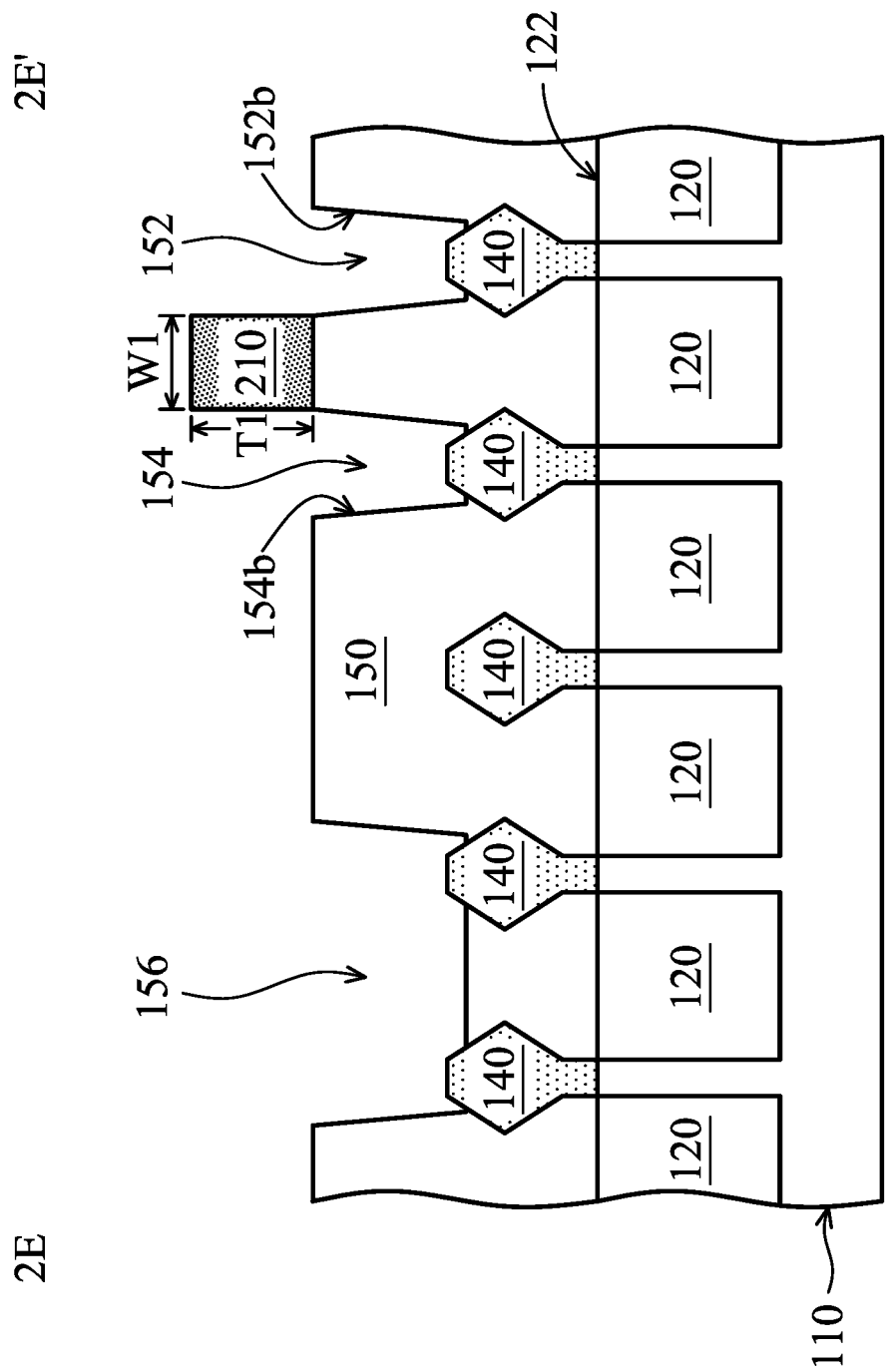
Figures 1, 2E:
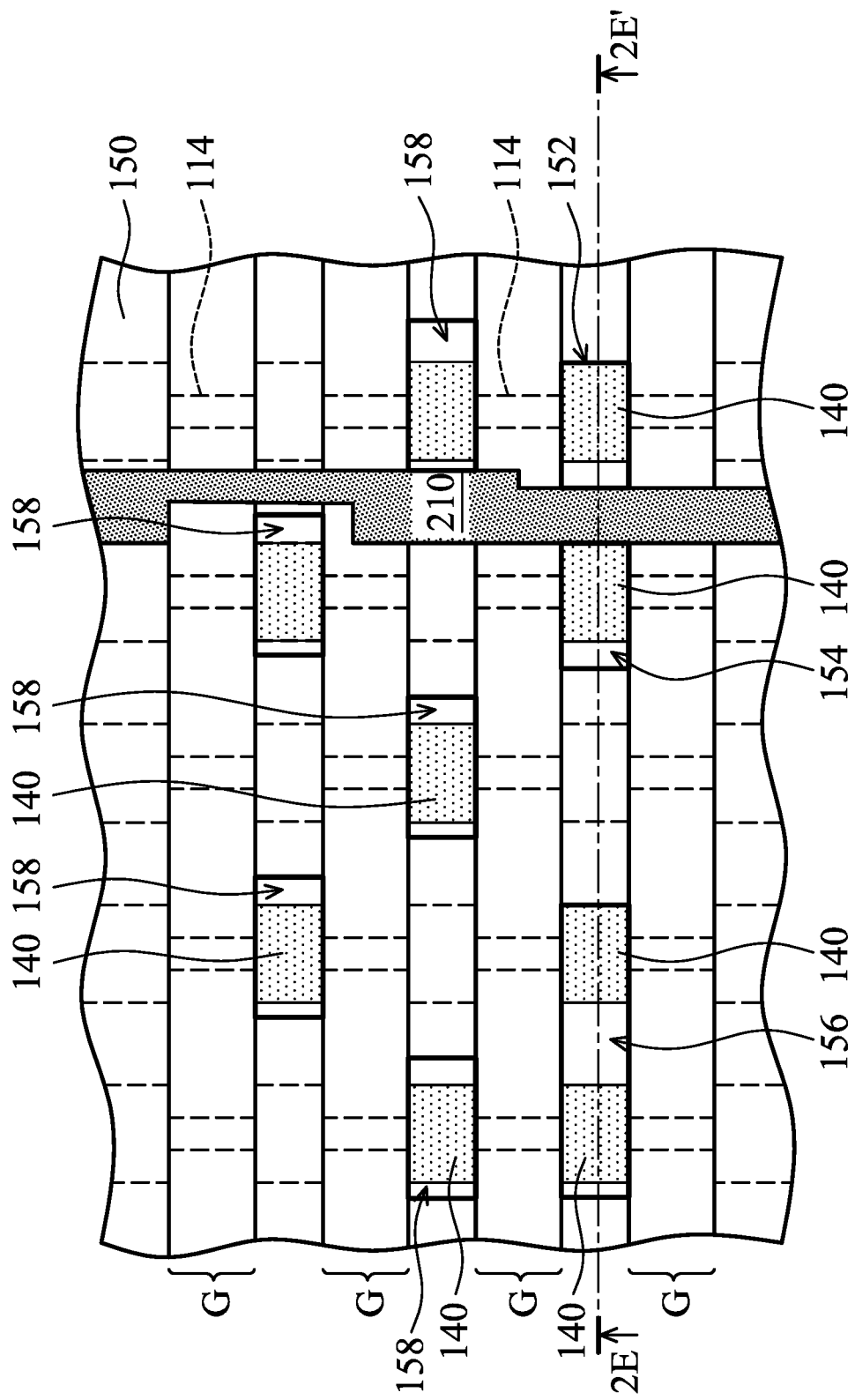

FIG. 2E-1 is a top view of the semiconductor device structure of FIG. 2E, in accordance with some embodiments. FIG. 2E is a cross-sectional view illustrating the semiconductor device structure along a sectional line 2E-2E' in FIG. 2E-1, in accordance with some embodiments.

As shown in FIGS. 2D, 2E and 2E-1, the dielectric layer 150 exposed by the openings 222, 224, and 226 is removed to form recesses 152, 154, 156, and 158, in accordance with some embodiments. The recesses 152 and 154 are under the opening 222, in accordance with some embodiments. The recess 152 and 154 respectively expose the epitaxial structures 140 thereunder, in accordance with some embodiments.

The recess 156 is under the opening 224, in accordance with some embodiments. The recess 156 exposes two adjacent epitaxial structures 140 thereunder, in accordance with some embodiments. The recesses 158 are respectively under the openings 226, in accordance with some embodiments. Each recess 158 exposes one epitaxial structure 140 thereunder, in accordance with some embodiments. Thereafter, as shown in FIGS. 2D, 2E and 2E-1, the mask layer 220 is removed, in accordance with some embodiments.

Figure 2F:
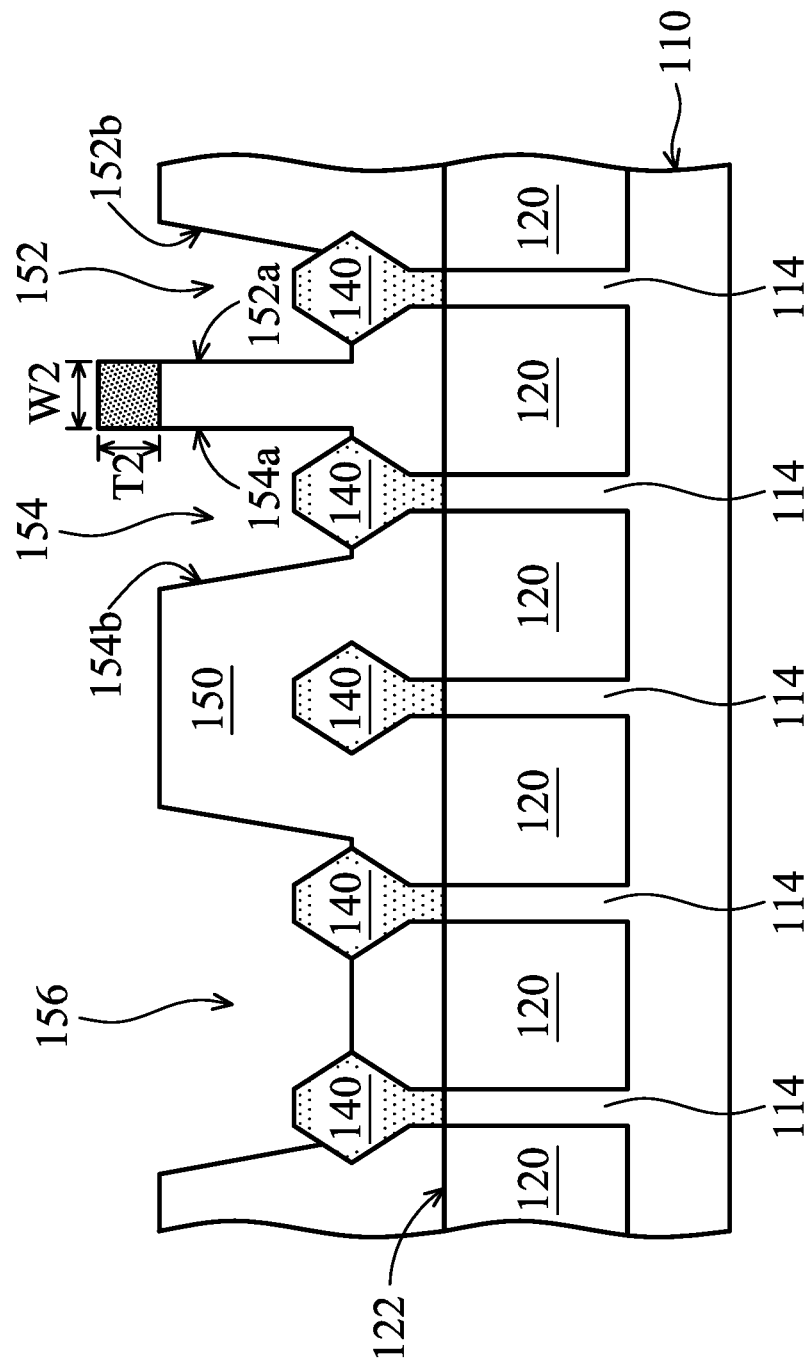
Figures 1, 2F:
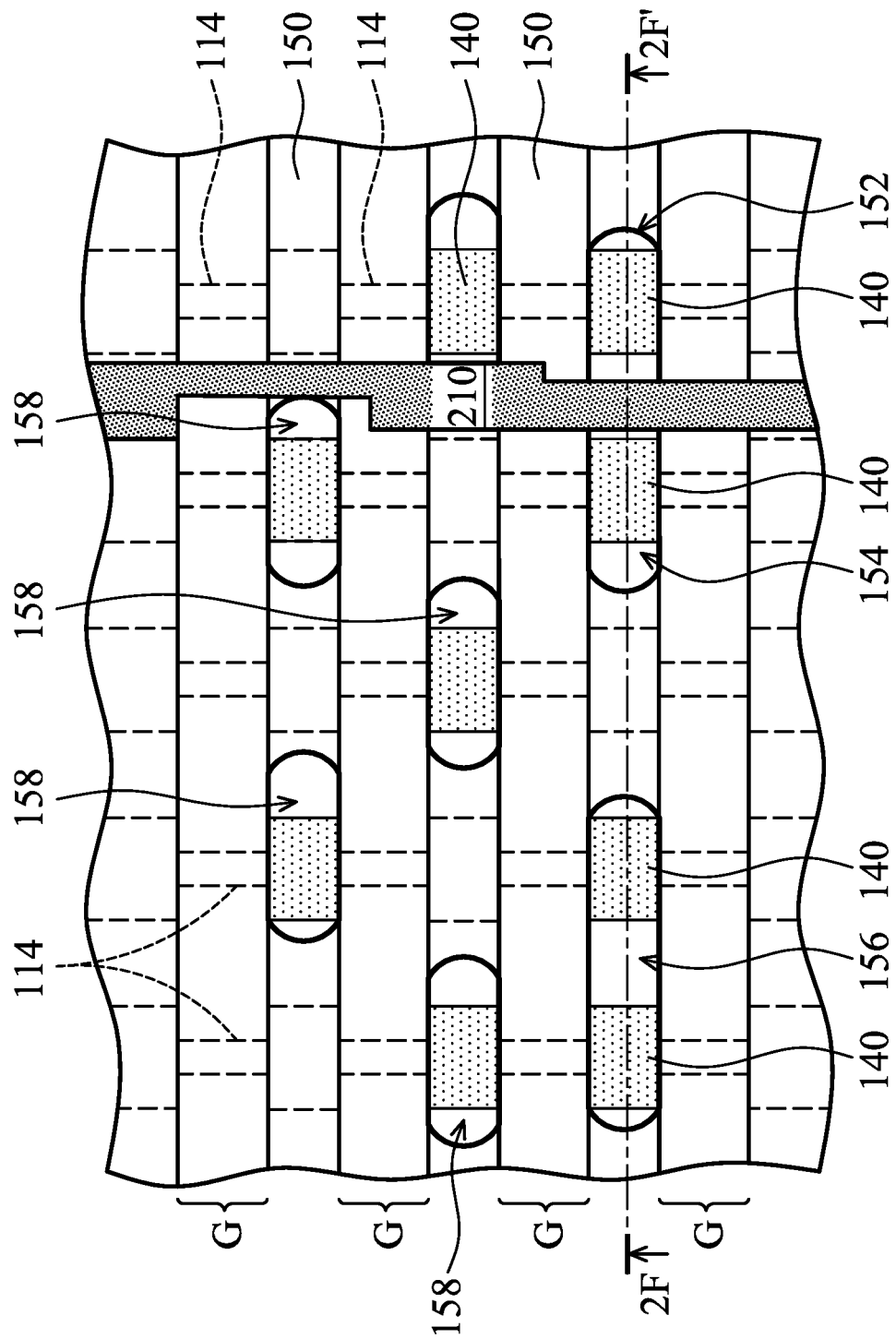

As shown in FIGS. 2F and 2F-1, the dielectric layer 150 adjacent to the recesses 152, 154, 156, and 158 is partially removed to widen the recesses 152, 154, 156, and 158, in accordance with some embodiments. The widened recesses 152, 154, 156, and 158 of FIGS. 2F and 2F-1 are respectively wider than the original recesses 152, 154, 156, and 158 of FIGS. 2E and 2E-1, in accordance with some embodiments.

In some embodiments, the removal process further partially removes the mask layer 210. Therefore, a width W2 of the mask layer 210 after the removal process (as shown in FIG. 2F) is less than a width W1 of the mask layer 210 before the removal process (as shown in FIG. 2E), in accordance with some embodiments. A thickness T2 of the mask layer 210 after the removal process (as shown in FIG. 2F) is less than a thickness T1 of the mask layer 210 before the removal process (as shown in FIG. 2E), in accordance with some embodiments.

As shown in FIGS. 2F and 2F-1, the recess 152 has inner walls 152a and 152b, in accordance with some embodiments. The inner wall 152b is opposite the inner wall 152a, in accordance with some embodiments. The inner wall 152a is under the mask layer 210, in accordance with some embodiments. The isolation layer 120 has a top surface 122, in accordance with some embodiments.

In some embodiments, a slope of the inner wall 152a relative to the top surface 122 is greater than a slope of the inner wall 152b relative to the top surface 122. The slope of the inner wall 152b of FIG. 2F is less than a slope of the inner wall 152b of FIG. 2E, in accordance with some embodiments.

As shown in FIGS. 2F and 2F-1, the recess 154 has inner walls 154a and 154b, in accordance with some embodiments. The inner wall 154b is opposite the inner wall 154a, in accordance with some embodiments. The inner wall 154a is under the mask layer 210, in accordance with some embodiments.

In some embodiments, a slope of the inner wall 154a relative to the top surface 122 is greater than a slope of the inner wall 154b relative to the top surface 122. The slope of the inner wall 154b of FIG. 2F is less than a slope of the inner wall 154b of FIG. 2E, in accordance with some embodiments. The inner walls 152a and 154a are between the inner walls 152b and 154b, in accordance with some embodiments.

Figure 2G:
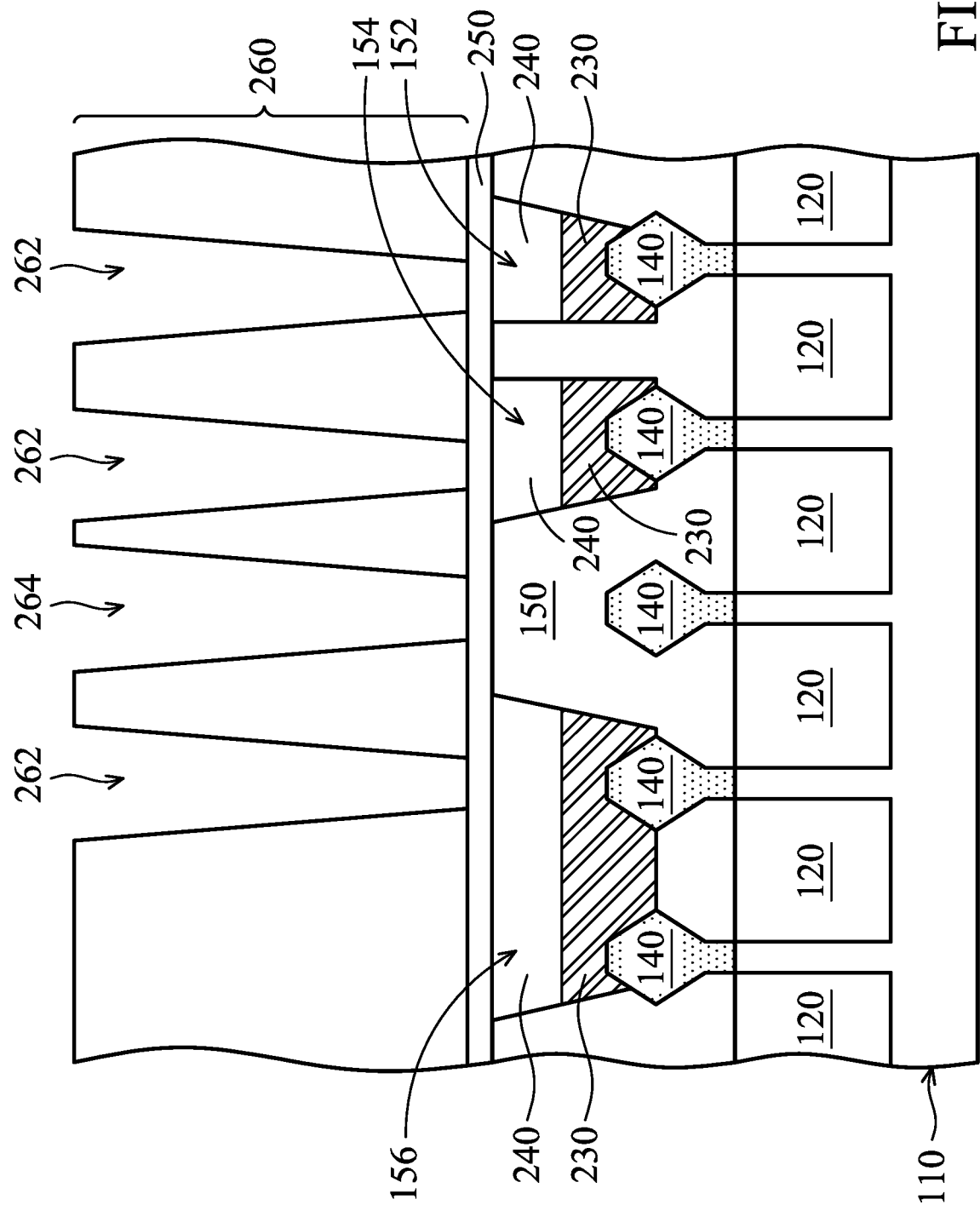

As shown in FIG. 2G, the mask layer 210 is removed, in accordance with some embodiments. The removal process includes an etching process, such as a dry etching process or a wet etching process, in accordance with some embodiments. As shown in FIG. 2G, a conductive layer 230 is formed in the recesses 152, 154, 156, and 158 (as shown in FIG. 2F-1), in accordance with some embodiments. The conductive layer 230 is made of a conductive material, such as metal (e.g., tungsten, copper, or aluminum) or an alloy thereof, in accordance with some embodiments. The conductive layer 230 is formed using a deposition process and an etching back process, in accordance with some embodiments.

As shown in FIG. 2G, a cap layer 240 is formed over the conductive layer 230 and in the recesses 152, 154, 156, and 158 (as shown in FIG. 2F-1), in accordance with some embodiments. The cap layer 240 is made of a nitrogen-containing material (e.g., $Si_3N_4$, $Zr_3N_4$ or $Ta(CN)_5$), a silicon-containing material (e.g., $SiO_2$, HfSi, SiOC, ZrSi, $Si_3N_4$, SiOCN, Si, SiCN), an aluminum-containing material (e.g., $Al_2O_3$, AlON (aluminum oxynitride), or ZrAlO), an oxygen-containing material (e.g., $ZrO_2$, $HfO_2$, $TiO_2$, ZnO, $Ta_2O_5$, $La_2O_3$ or $Y_2O_3$) or another suitable material, in accordance with some embodiments.

The cap layer 240 is formed using a deposition process, such as a chemical vapor deposition (CVD) process, an atomic layer deposition (ALD) process, or a physical vapor deposition (PVD) process, and a planarization process, such as a chemical mechanical polishing process, in accordance with some embodiments.

As shown in FIG. 2G, a mask layer 250 is formed over the cap layer 240 and the dielectric layer 150, in accordance with some embodiments. The mask layer 250 is made of a nitrogen containing material (e.g., $Si_3N_4$, $Zr_3N_4$ or $Ta(CN)_5$), a silicon-containing material (e.g., $SiO_2$, HfSi, SiOC, ZrSi, $Si_3N_4$, SiOCN, Si or SiCN), an aluminum-containing material (e.g., $Al_2O_3$, AlON (aluminum oxynitride) or ZrAlO), an oxygen-containing material (e.g., $ZrO_2$, $HfO_2$, $TiO_2$, ZnO, $Ta_2O_5$, $La_2O_3$ or $Y_2O_3$) or another suitable material. The mask layer 250 is formed using a deposition process, such as a chemical vapor deposition (CVD) process, an atomic layer deposition (ALD) process, or a physical vapor deposition (PVD) process, in accordance with some embodiments.

As shown in FIG. 2G, a mask layer 260 is formed over the mask layer 250, in accordance with some embodiments. The mask layer 260 has openings 262 and 264, in accordance with some embodiments. The openings 262 are over the cap layer 240 and the conductive layer 230, in accordance with some embodiments. The openings 264 are over the epitaxial structures 140, in accordance with some embodiments. There is no cap layer 240 and no conductive layer 230 between the openings 264 and the epitaxial structures 140, in accordance with some embodiments. The mask layer 260 is made of an insulating material, such as a polymer material (e.g., a photoresist material), in accordance with some embodiments.

Figure 2H:
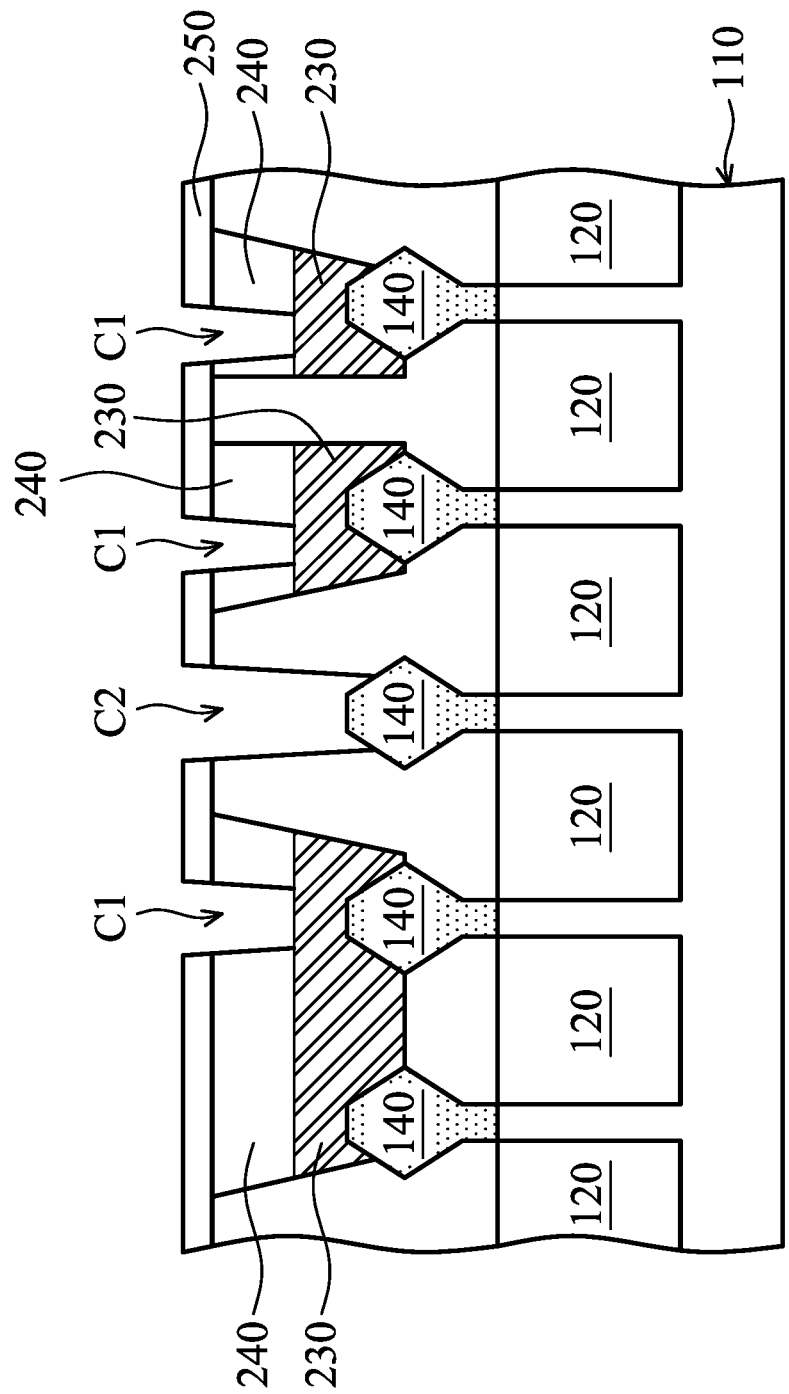

As shown in FIGS. 2G and 2H, the cap layer 240 and the mask layer 250 are partially removed through the openings 262 and 264 to form contact holes C1 and C2 in the cap layer 240 and the mask layer 250, in accordance with some embodiments. The contact holes C1 and C2 pass through the cap layer 240 and the mask layer 250, in accordance with some embodiments.

The contact holes C1 expose the conductive layer 230, in accordance with some embodiments. The contact holes C2 expose the epitaxial structures 140, in accordance with some embodiments. The removal process includes an etching process, such as a dry etching process or a wet etching process, in accordance with some embodiments.

Figure 2I:
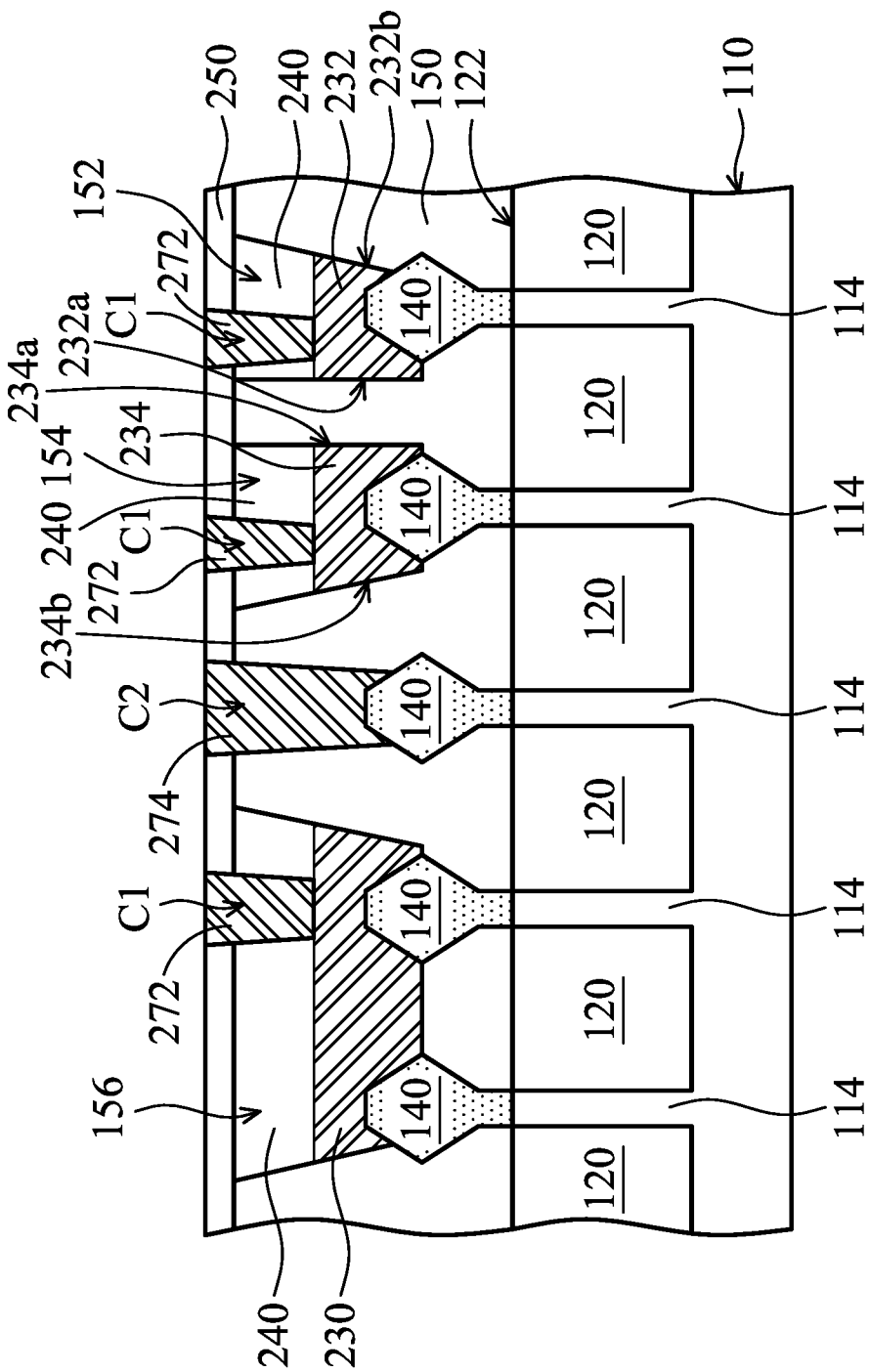
Figures 1, 2I:
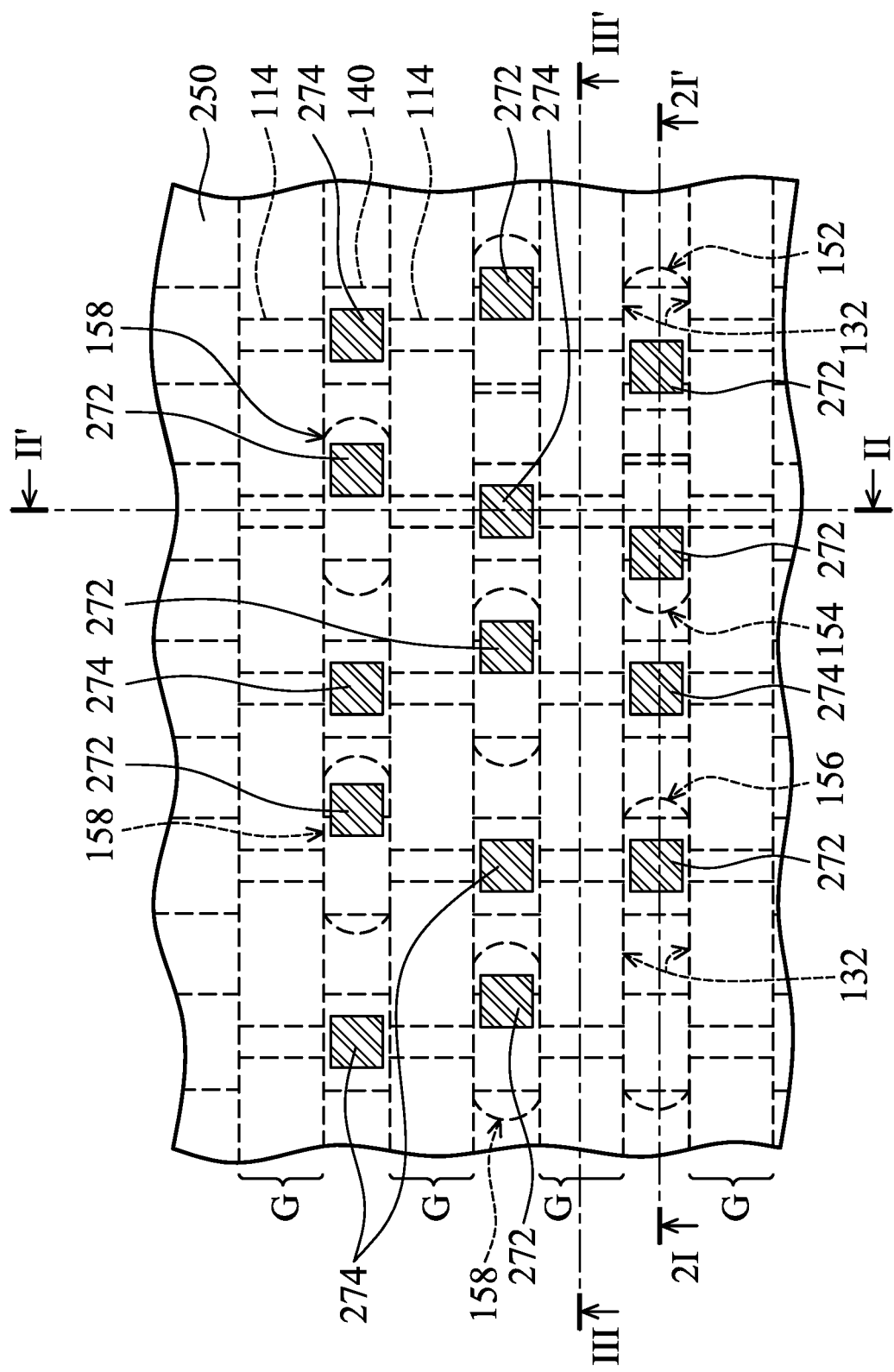
Figures 2, 2I:
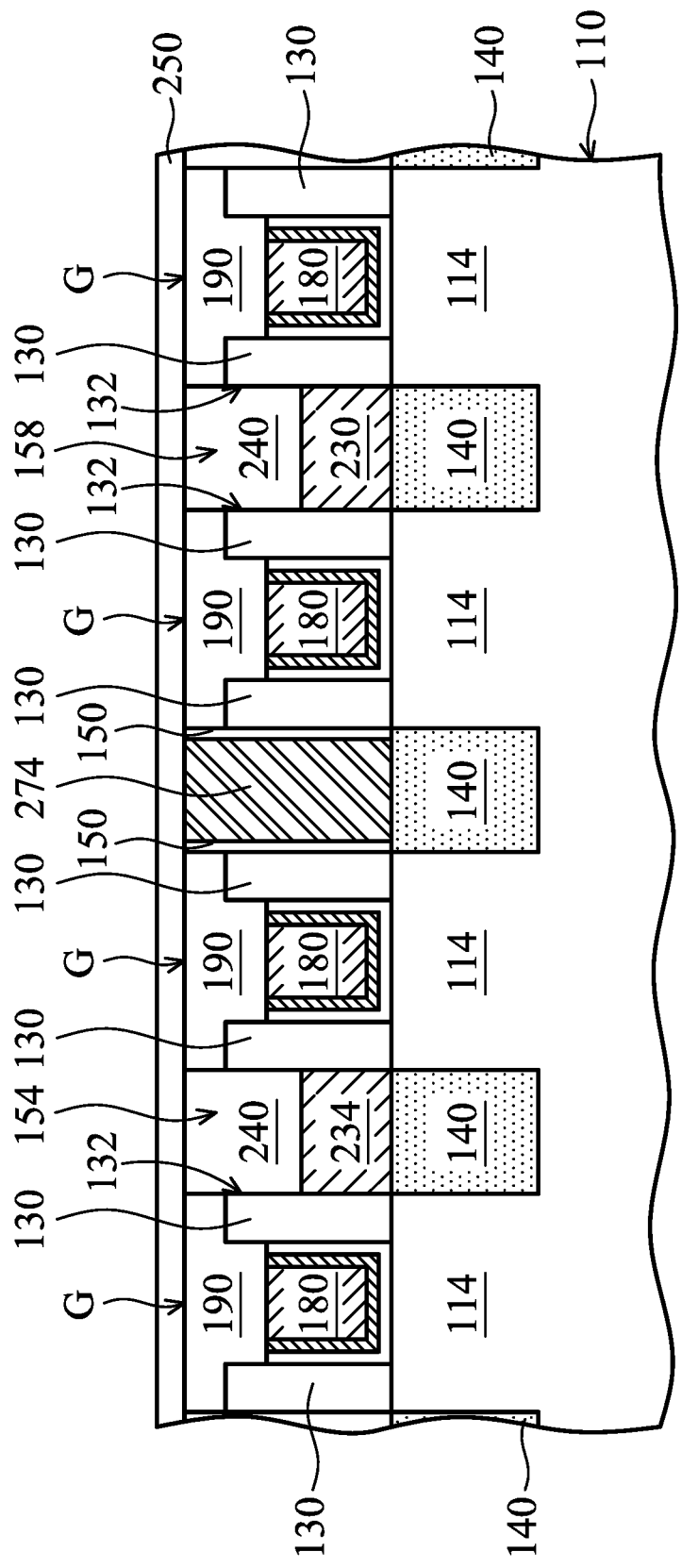
Figures 2, 2I, 3:
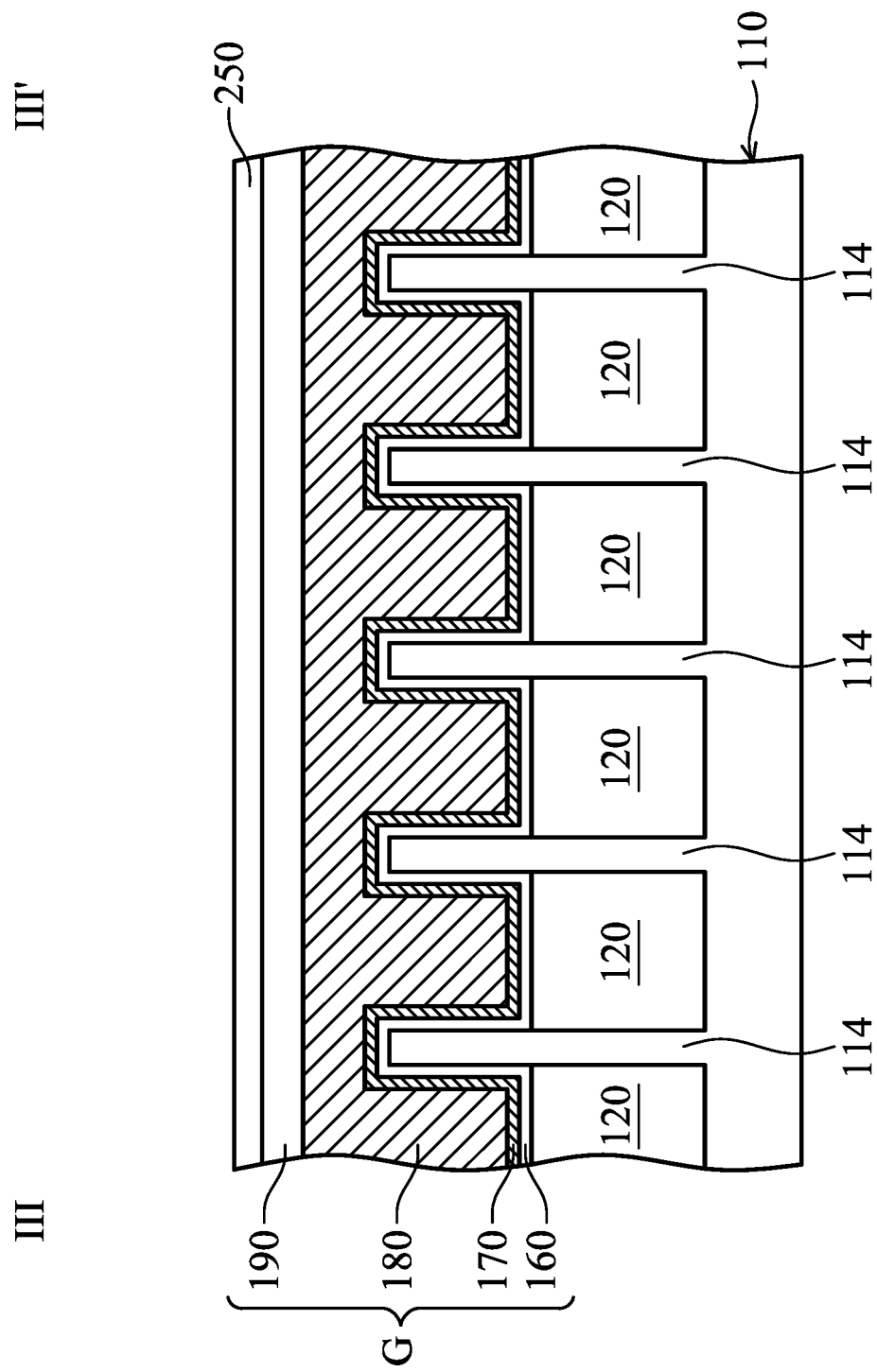

As shown in FIGS. 2I and 2I-1, contact structures 272 and 274 are respectively formed in the contact holes C1 and C2, in accordance with some embodiments. Each contact structure 272 is in direct contact with (or connected to) the conductive layer 230 thereunder, in accordance with some embodiments. Each contact structure 274 is in direct contact with (or connected to) the epitaxial structures 140 thereunder, in accordance with some embodiments.

The contact structure 272 is misaligned with the fin structure 114, in accordance with some embodiments. In some embodiments, a central portion of the contact structure 272 is misaligned with a central portion of the epitaxial structure 140. The contact structure 274 is substantially aligned with the epitaxial structure 140 thereunder, in accordance with some embodiments. The contact structure 274 is substantially aligned with the fin structure 114 thereunder, in accordance with some embodiments. That is, the contact structure 274, the epitaxial structure 140, and the fin structure 114 are arranged along a substantial straight line (not shown), in accordance with some embodiments.

The term "substantially aligned with" in the application may include small deviations from alignment geometries. The term "substantial straight line" in the application may include small deviations from straight line geometries. The deviations may be due to manufacturing processes.

The conductive layer 230 has a first portion 232 and a second portion 234, in accordance with some embodiments. The first portion 232 is formed in the recess 152 and on the epitaxial structure 140, in accordance with some embodiments. The first portion 232 wraps around a top portion of the epitaxial structure 140 thereunder, in accordance with some embodiments.

The first portion 232 has two opposite sidewalls 232a and 232b, in accordance with some embodiments. The sidewall 232a faces the second portion 234, in accordance with some embodiments. In some embodiments, a slope of the sidewall 232a relative to the top surface 122 is greater than a slope of the sidewall 232b relative to the top surface 122.

The second portion 234 is formed in the recess 154 and on the epitaxial structure 140, in accordance with some embodiments. The second portion 234 wraps around a top portion of the epitaxial structure 140 thereunder, in accordance with some embodiments. The second portion 234 has two opposite sidewalls 234a and 234b, in accordance with some embodiments. The sidewall 234a faces the first portion 232, in accordance with some embodiments.

In some embodiments, a slope of the sidewall 234a relative to the top surface 122 is greater than a slope of the sidewall 234b relative to the top surface 122. The sidewalls 232a and 234a are between the sidewalls 232b and 234b, in accordance with some embodiments. The sidewalls 232a and 234a are between the epitaxial structures 140 under the first portion 232 and the second portion 234, in accordance with some embodiments.

The contact structures 272 and 274 are made of a conductive material, such as metal (e.g., tungsten, copper, or aluminum) or an alloy thereof, in accordance with some embodiments. The contact structures 272 and 274 and the conductive layer 230 are made of the same conductive material, in accordance with some embodiments. In some other embodiments, the material of the contact structures 272 and 274 is different from the material of the conductive layer 230. The contact structures 272 and 274 are formed using a deposition process and a planarization process, such as a chemical mechanical polishing process, in accordance with some embodiments.

FIG. 2I-2 is a cross-sectional view illustrating the semiconductor device structure along a sectional line II-II' in FIG. 2I-1, in accordance with some embodiments. As shown in FIGS. 2I, 2I-1 and 2I-2, each spacer 130 has a sidewall 132 facing away from the gate stack G adjacent thereto, in accordance with some embodiments. The recesses 152, 154, 156, and 158 expose sidewalls 132 of the spacers 130, in accordance with some embodiments. The conductive layer 230 is in direct contact with the sidewalls 132, in accordance with some embodiments. The spacer 130 separates the gate stack G from the conductive layer 230, in accordance with some embodiments.

FIG. 2I-3 is a cross-sectional view illustrating the semiconductor device structure along a sectional line III-III' in FIG. 2I-1, in accordance with some embodiments. As shown in FIG. 2I-3, the protection layer 190 conformally covers the gate electrode layer 180, in accordance with some embodiments. The mask layer 250 conformally covers the protection layer 190, in accordance with some embodiments.

In accordance with some embodiments, semiconductor device structures and methods for forming the same are provided. The methods (for forming the semiconductor device structure) include forming a dielectric layer over a substrate with two adjacent epitaxial structures; forming a first mask layer over the dielectric layer and between two adjacent epitaxial structures; forming a second mask layer over the first mask layer and the dielectric layer, wherein the second mask layer has an opening extending across the first mask layer and the two adjacent epitaxial structures; and removing the dielectric layer through the opening to form a first recess and a second recess respectively exposing the two adjacent epitaxial structures. Since the distance between the first recess and the second recess is adjustable by adjusting a width of the first mask layer, the methods are able to form the first recess and the second recess spaced apart by a small distance.

In accordance with some embodiments, a method for forming a semiconductor device structure is provided. The method includes forming a first epitaxial structure and a second epitaxial structure over a semiconductor substrate. The method includes forming a dielectric layer over the first epitaxial structure, the second epitaxial structure, and the semiconductor substrate. The method includes forming a first mask layer over the dielectric layer and between the first epitaxial structure and the second epitaxial structure. The method includes forming a second mask layer over the dielectric layer and the first mask layer. The second mask layer has an opening partially exposing the first mask layer and the dielectric layer covering the first epitaxial structure and the second epitaxial structure. The method includes partially removing the dielectric layer covering the first epitaxial structure and the second epitaxial structure through the opening to form a first recess and a second recess in the dielectric layer. The first recess and the second recess respectively expose the first epitaxial structure and the second epitaxial structure. The method includes removing the second mask layer. The method includes removing the first mask layer. The method includes forming a first conductive layer and a second conductive layer respectively in the first recess and the second recess.

In accordance with some embodiments, a method for forming a semiconductor device structure is provided. The method includes providing a substrate having a first fin structure and a second fin structure. The method includes forming a first epitaxial structure and a second epitaxial structure respectively over the first fin structure and the second fin structure. The method includes forming a dielectric layer over the first epitaxial structure, the second epitaxial structure, and the semiconductor substrate. The method includes forming a first mask layer over the dielectric layer and between the first fin structure and the second fin structure. The method includes forming a second mask layer over the dielectric layer and the first mask layer. The second mask layer has an opening extending continuously across the first epitaxial structure, the first mask layer, and the second epitaxial structure. The method includes removing the dielectric layer covering the first epitaxial structure and the second epitaxial structure through the opening to form a first recess and a second recess in the dielectric layer. The first recess and the second recess respectively expose the first epitaxial structure and the second epitaxial structure. The method includes removing the second mask layer. The method includes removing the first mask layer. The method includes forming a first conductive layer and a second conductive layer respectively in the first recess and the second recess.

In accordance with some embodiments, a semiconductor device structure is provided. The semiconductor device structure includes a substrate having a first fin structure and a second fin structure. The semiconductor device structure includes a first epitaxial structure and a second epitaxial structure respectively over the first fin structure and the second fin structure. The semiconductor device structure includes a dielectric layer over the first epitaxial structure, the second epitaxial structure, and the semiconductor substrate. The semiconductor device structure includes a first conductive layer in the dielectric layer and on the first epitaxial structure. The first conductive layer has a first sidewall and a second sidewall opposite the first sidewall, and a first slope of the first sidewall is greater than a second slope of the second sidewall. The semiconductor device structure includes a second conductive layer in the dielectric layer and on the second epitaxial structure. The second conductive layer has a third sidewall and a fourth sidewall opposite the third sidewall, a third slope of the third sidewall is greater than a fourth slope of the fourth sidewall, and the first sidewall and the third sidewall are between the second sidewall and the fourth sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first epitaxial structure and a second epitaxial structure over a semiconductor substrate;
    forming a dielectric layer over the first epitaxial structure, the second epitaxial structure, and the semiconductor substrate;
    forming a first mask layer over the dielectric layer and between the first epitaxial structure and the second epitaxial structure;
    forming a second mask layer over the dielectric layer and the first mask layer, wherein the second mask layer has an opening partially exposing the first mask layer and the dielectric layer covering the first epitaxial structure and the second epitaxial structure;
    removing the dielectric layer covering the first epitaxial structure and the second epitaxial structure through the opening to form a first recess and a second recess in the dielectric layer, wherein the first recess and the second recess respectively expose the first epitaxial structure and the second epitaxial structure;
    removing the second mask layer;
    removing the first mask layer; and
    forming a first conductive layer and a second conductive layer respectively in the first recess and the second recess.

2. The method for forming the semiconductor device structure as claimed in claim 1, wherein the first mask layer and the second mask layer are made of different materials.

3. The method for forming the semiconductor device structure as claimed in claim 1, further comprising:
    forming a first cap layer and a second cap layer respectively in the first recess and the second recess after forming the first conductive layer and the second conductive layer respectively in the first recess and the second recess, wherein the first cap layer and the second cap layer are respectively over the first conductive layer and the second conductive layer.

4. The method for forming the semiconductor device structure as claimed in claim 3, further comprising:
    partially removing the first cap layer and the second cap layer to form a first contact hole and a second contact hole respectively in the first cap layer and the second cap layer, wherein the first contact hole and the second contact hole respectively expose the first conductive layer and the second conductive layer; and
    forming a first contact structure and a second contact structure respectively in the first contact hole and the second contact hole.

5. The method for forming the semiconductor device structure as claimed in claim 4, further comprising:
    forming a third mask layer over the dielectric layer, the first cap layer, and the second cap layer after forming the first cap layer and the second cap layer respectively in the first recess and the second recess and before forming the first contact hole and the second contact hole, wherein the first contact hole and the second contact hole pass through the third mask layer, and the first contact structure and the second contact structure pass through the third mask layer.

6. The method for forming the semiconductor device structure as claimed in claim 4, wherein the semiconductor substrate has a first fin structure and a second fin structure, the first epitaxial structure and the second epitaxial structure are respectively formed over the first fin structure and the second fin structure, the first contact structure is misaligned with the first fin structure, and the second contact structure is misaligned with the second fin structure.

7. The method for forming the semiconductor device structure as claimed in claim 6, further comprising:
    forming a gate stack over the semiconductor substrate and wrapping around a first upper portion of the first fin structure and a second upper portion of the second fin structure after forming the dielectric layer over the first epitaxial structure, the second epitaxial structure, and the semiconductor substrate and before forming the first mask layer over the dielectric layer and between the first epitaxial structure and the second epitaxial structure.

8. The method for forming the semiconductor device structure as claimed in claim 7, further comprising:
    forming a first spacer and a second spacer over the semiconductor substrate and wrapping around the first upper portion and the second upper portion before forming the first epitaxial structure and the second epitaxial structure over the semiconductor substrate, wherein the gate stack is between the first spacer and the second spacer, and the first recess and the second recess expose a sidewall of the first spacer.

9. The method for forming the semiconductor device structure as claimed in claim 8, wherein the first conductive layer and the second conductive layer are in direct contact with the sidewall of the first spacer.

10. The method for forming the semiconductor device structure as claimed in claim 1, further comprising:
    partially removing the dielectric layer adjacent to the first recess and the second recess to widen the first recess and the second recess after removing the second mask layer and before removing the first mask layer.

11. A method for forming a semiconductor device structure, comprising:
    providing a substrate having a first fin structure and a second fin structure;
    forming a first epitaxial structure and a second epitaxial structure respectively over the first fin structure and the second fin structure;
    forming a dielectric layer over the first epitaxial structure, the second epitaxial structure, and the semiconductor substrate;
    forming a first mask layer over the dielectric layer and between the first fin structure and the second fin structure;
    forming a second mask layer over the dielectric layer and the first mask layer, wherein the second mask layer has an opening extending continuously across the first epitaxial structure, the first mask layer, and the second epitaxial structure;

removing the dielectric layer covering the first epitaxial structure and the second epitaxial structure through the opening to form a first recess and a second recess in the dielectric layer, wherein the first recess and the second recess respectively expose the first epitaxial structure and the second epitaxial structure;

removing the second mask layer;

removing the first mask layer; and forming a first conductive layer and a second conductive layer respectively in the first recess and the second recess.

12. The method for forming the semiconductor device structure as claimed in claim 11, further comprising:

partially removing the dielectric layer adjacent to the first recess and the second recess to widen the first recess and the second recess after removing the second mask layer and before removing the first mask layer.

13. The method for forming the semiconductor device structure as claimed in claim 12, wherein after partially removing the dielectric layer adjacent to the first recess and the second recess, the first recess has a first inner wall and a second inner wall opposite the first inner wall, the first inner wall is under the first mask layer, and a first slope of the first inner wall is greater than a second slope of the second inner wall.

14. The method for forming the semiconductor device structure as claimed in claim 12, wherein the partially removing of the dielectric layer adjacent to the first recess and the second recess further partially removes the first mask layer.

15. The method for forming the semiconductor device structure as claimed in claim 11, wherein the second mask layer is thicker than the first mask layer.

16. A method for forming a semiconductor device structure, comprising:

forming a first epitaxial structure and a second epitaxial structure over a semiconductor substrate;

forming a dielectric layer over the first epitaxial structure, the second epitaxial structure, and the semiconductor substrate;

forming a mask over the dielectric layer, wherein the mask has a first portion and a second portion, the first portion is between the first epitaxial structure and the second epitaxial structure, the second portion surrounds the first portion and the dielectric layer over the first epitaxial structure and the second epitaxial structure, the mask has a first through hole and a second through hole respectively over the first epitaxial structure and the second epitaxial structure, and the first portion and the second portion are made of different materials;

removing the dielectric layer through the first through hole and the second through hole to form a first recess and a second recess in the dielectric layer, wherein the first recess and the second recess respectively expose the first epitaxial structure and the second epitaxial structure;

removing the mask; and forming a first conductive layer and a second conductive layer respectively in the first recess and the second recess.

17. The method for forming the semiconductor device structure as claimed in claim 16, wherein the removing of the mask comprises:

removing the second portion; and after removing the second portion, removing the first portion.

18. The method for forming the semiconductor device structure as claimed in claim 17, further comprising:

after removing the second portion and before removing the first portion, partially removing the dielectric layer adjacent to the first recess and the second recess to widen the first recess and the second recess.

19. The method for forming the semiconductor device structure as claimed in claim 18, wherein the partially removing of the dielectric layer adjacent to the first recess and the second recess further partially removes the first portion.

20. The method for forming the semiconductor device structure as claimed in claim 18, wherein after partially removing the dielectric layer adjacent to the first recess and the second recess, the first recess has a first inner wall and a second inner wall opposite the first inner wall, the first inner wall is under the first portion, and a first slope of the first inner wall is greater than a second slope of the second inner wall.

* * * * *